(12) United States Patent
Nakamura et al.

(10) Patent No.: US 10,668,496 B2
(45) Date of Patent: Jun. 2, 2020

(54) IMPRINT TEMPLATE TREATMENT APPARATUS

(71) Applicants: SHIBAURA MECHATRONICS CORPORATION, Yokohama-shi (JP); TOSHIBA MEMORY CORPORATION, Minato-ku (JP)

(72) Inventors: Satoshi Nakamura, Yokohama (JP); Kensuke Demura, Yokohama (JP); Daisuke Matsushima, Yokohama (JP); Masayuki Hatano, Minato-ku (JP); Hiroyuki Kashiwagi, Minato-ku (JP)

(73) Assignees: SHIBAURA MECHATRONICS CORPORATION, Yokohama-shi (JP); TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/717,435

(22) Filed: Sep. 27, 2017

(65) Prior Publication Data
US 2018/0015497 A1    Jan. 18, 2018

Related U.S. Application Data

(63) Continuation of application No. PCT/JP2016/060824, filed on Mar. 31, 2016.

(30) Foreign Application Priority Data

Mar. 31, 2015 (JP) .................. 2015-074110
Jun. 3, 2015 (JP) .................. 2015-113045

(51) Int. Cl.
*B05C 5/02* (2006.01)
*B29C 33/38* (2006.01)
(Continued)

(52) U.S. Cl.
CPC .......... *B05C 5/0225* (2013.01); *B05C 5/0204* (2013.01); *B29C 33/3842* (2013.01); *G03F 7/0002* (2013.01); *B29C 59/022* (2013.01)

(58) Field of Classification Search
USPC ....... 118/300, 305, 679–682, 686, 323, 321; 425/150, 385
See application file for complete search history.

(56) References Cited

U.S. PATENT DOCUMENTS 9,804,503 B2 * 10/2017 Tanaka .................. G03F 7/0002
2011/0244131 A1    10/2011 Kawamura et al.
(Continued)

FOREIGN PATENT DOCUMENTS

JP    2008-100378    5/2008
JP    2011-133750    7/2011
(Continued)

OTHER PUBLICATIONS

English Translation JP-2015207655A Nov. 2015 (Year: 2015).*
International Search Report dated Jun. 14, 2016 in PCT/JP2016/060824, filed on Mar. 31, 2016.

*Primary Examiner* — Yewebdar T Tadesse
(74) *Attorney, Agent, or Firm* — Oblon, McClelland, Maier & Neustadt, L.L.P.

(57) ABSTRACT

According to one embodiment, an imprint template manufacturing apparatus includes a stage, a supply head, a moving mechanism, and a controller. The stage supports a template that includes a base having a main surface, and a convex portion provided on the main surface and having an end surface on a side opposite to the main surface. A concavo-convex pattern to be pressed against a liquid material to be transferred is formed on the end surface. The supply head supplies a liquid-repellent material in a liquid form to the template on the stage. The moving mechanism moves the stage and the supply head relative to each other (Continued)

in a direction along the stage. The controller controls the supply head and the moving mechanism such that the supply head applies the liquid-repellent material to at least the side surface of the convex portion so as to avoid the concavo-convex pattern.

11 Claims, 4 Drawing Sheets

(51) Int. Cl.
*G03F 7/00* (2006.01)
*B29C 59/02* (2006.01)

(56) References Cited

U.S. PATENT DOCUMENTS

| | | | |
|---|---|---|---|
| 2013/0059090 A1* | 3/2013 | Kawamura | G03F 7/0002 |
| | | | 427/511 |
| 2013/0064415 A1 | 3/2013 | Ota | |
| 2014/0209565 A1 | 7/2014 | Nakamura et al. | |
| 2016/0259240 A1* | 9/2016 | Morishita | G03F 1/72 |
| 2017/0165898 A1* | 6/2017 | Meissl | B29C 35/02 |

FOREIGN PATENT DOCUMENTS

| | | |
|---|---|---|
| JP | 2011-224965 | 11/2011 |
| JP | 2013-77695 | 4/2013 |
| JP | 2013-175640 | 9/2013 |
| JP | 2013-202900 | 10/2013 |
| JP | 5537517 | 7/2014 |
| JP | 2015207655 A * | 11/2015 |
| TW | 201305724 A1 | 2/2013 |

\* cited by examiner

IMPRINT TEMPLATE TREATMENT APPARATUS

CROSS-REFERENCE TO THE RELATED APPLICATION

This application is based upon and claims the benefit of priority from International Application No. PCT/JP2016/060824, filed on Mar. 31, 2016; Japanese Patent Application No. 2015-074110, filed on Mar. 31, 2015 and Japanese Patent Application No. 2015-113045, filed on Jun. 3, 2015; the entire contents of all of which are incorporated herein by reference.

FIELD

Embodiments described herein relate generally to an imprint template manufacturing apparatus.

BACKGROUND

In recent years, an imprinting method has been proposed as a method for forming a fine pattern on a workpiece such as a semiconductor substrate. In this imprinting method, a mold (master) having a concavo-convex pattern formed thereon is pressed against the surface of a liquid material to be transferred (for example, photocurable resin) such as a resist applied on a workpiece. Then, light is irradiated from the surface opposite to the surface on which the pattern is formed, and the mold is removed from the cured material to be transferred. Thereby, the concavo-convex pattern is transferred to the material to be transferred. A template is used as a mold to be pressed against the surface of the liquid material to be transferred. This template is also called mold, imprint mold or stamper.

The template is formed of quartz or the like having high translucency so that light such as ultraviolet rays is easily transmitted in a step (transfer step) of curing the material to be transferred. The template is provided with a convex portion (convexity) on its main surface, and a concavo-convex pattern to be pressed against the liquid material to be transferred is formed on the convex portion. For example, the convex portion having a concavo-convex pattern is referred to as "mesa portion", and a portion other than the mesa portion on the main surface of the template is referred to as "off-mesa portion".

However, when the template is pressed against the liquid material to be transferred, the liquid material to be transferred seeps out from the end of the convex portion. Although it is a small amount, the liquid material to be transferred having seeped out may sometimes be raised along the side surface (side wall) of the convex portion. The material to be transferred adhering to the side surface of the convex portion is cured in that state by light irradiation. Accordingly, when the template is separated from the material to be transferred, a raised portion is present in the material to be transferred, resulting in the occurrence of pattern abnormality.

In addition, when the template is separated from the material to be transferred, the raised portion of the material to be transferred sticks to the template. It thereafter may drop on the material to be transferred at some timing and become dust. If the template is pressed onto the dropped dust, the concavo-convex pattern on the template may be damaged, or the dropped dust enters in the concavo-convex pattern on the template and becomes foreign matter. Thus, template abnormality occurs. Further, if pattern transfer is continuously performed using a template having such a damaged concavo-convex pattern or a template into which a foreign matter has entered, a defect is generated in the pattern of the material to be transferred, thus resulting in the occurrence of pattern abnormality.

DETAILED DESCRIPTION

According to one embodiment, an imprint template manufacturing apparatus includes a stage, a supply head, a moving mechanism, and a controller. The stage is configured to support a template that includes a base having a main surface, and a convex portion provided on the main surface and having an end surface on a side opposite to the main surface. A concavo-convex pattern to be pressed against a liquid material to be transferred is formed on the end surface. The supply head is configured to supply a liquid-repellent material in a liquid form, which repels the liquid material to be transferred, to the template on the stage. The moving mechanism is configured to move the stage and the supply head relative to each other in a direction along the stage. The controller is configured to control the supply head and the moving mechanism such that the supply head applies the liquid-repellent material to at least the side surface of the convex portion so as to avoid the concavo-convex pattern.

First Embodiment

A first embodiment will be described with reference to FIGS. 1 to 8. The imprint template manufacturing apparatus according to the first embodiment is an example of a coating application apparatus that applies a liquid-repellent material in a liquid form onto a template to coat a part of the template.

Figure 1:
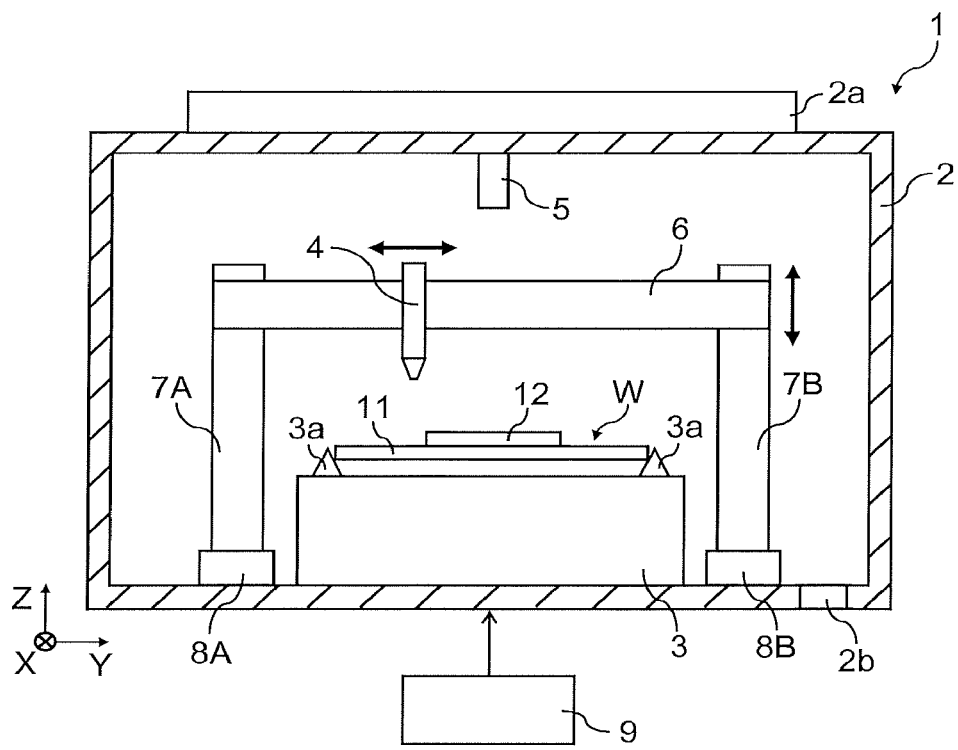
FIG. 1 is a diagram illustrating a schematic configuration of an imprint template manufacturing apparatus according to a first embodiment.

As illustrated in FIG. 1, an imprint template manufacturing apparatus 1 according to the first embodiment includes a treatment chamber 2 for treating a template W, a stage 3 on which the unprocessed template W is placed, a supply head 4 configured to supply a liquid-repellent material in a liquid form to the template W on the stage 3, an imaging unit 5 configured to photograph the template W on the stage 3, a Y-axis moving mechanism 6 configured to move the supply head 4 in the Y-axis direction, a pair of Z-axis moving mechanisms 7A and 7B configured to move the Y-axis moving mechanism 6 together with the supply head 4 in the Z-axis direction, a pair of X-axis moving mechanisms 8A and 8B configured to move the Z-axis moving mechanisms 7A and 7B in the X-axis direction, and a controller 9 configured to control each unit.

Figure 2:
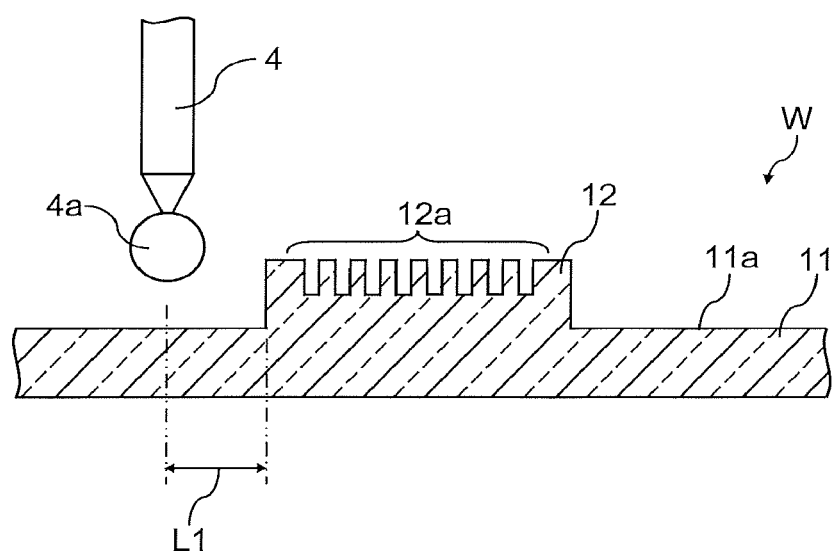
FIG. 2 is a first cross-sectional view for explaining a coating process of the first embodiment.

First, the template W to be coated will be described with reference to FIG. 2. As illustrated in FIG. 2, the template W includes a base 11 having a main surface 11a and a convex portion 12 provided on the main surface 11a of the base 11.

The base 11 has translucency, and is formed in a plate shape in which the main surface 11a is a flat surface. The plate shape of the base 11 is, for example, square or rectangular; however, the shape is not particularly limited. For example, a transparent substrate such as a quartz substrate can be used as the base 11. Note that, in an imprint process, light such as ultraviolet rays is irradiated to the opposite surface of the main surface 11a.

The convex portion 12 has translucency, and is integrally formed with the base 11 from the same material. A concavo-convex pattern 12a is formed on an end surface of the convex portion 12, that is, the surface (upper surface in FIG. 2) opposite to the main surface 11a side of the convex portion 12. The concavo-convex pattern 12a is pressed against a liquid material to be transferred (for example, photocurable resin). The pattern region in which the concavo-convex pattern 12a is formed on the end surface of the convex portion 12 is, for example, a square or rectangular region; however, the shape is not particularly limited.

Referring back to FIG. 1, the treatment chamber is formed in a box shape so as to be able to accommodate the stage 3, the supply head 4, the imaging unit 5, the moving mechanisms 6, 7A, 7B, 8A and 8B, and the like. A filter 2a is provided to the upper surface of the treatment chamber 2 to remove foreign matters in the air. An exhaust port 2b is provided to the lower surface (bottom surface) of the treatment chamber 2. In the treatment chamber 2, air flows from the filter 2a to the exhaust port 2b, and the inside of the treatment chamber 2 is kept clean by a down flow (vertical laminar flow). As the filter 2a, for example, a ULPA filter, a HEPA filter, or the like can be used.

The stage 3 includes a plurality of support members 3a such as pins, and is a support unit that supports the template W by the support members 3a. The stage 3 is fixed to the bottom surface of the treatment chamber 2; however, it is not so limited. For example, the stage 3 may be moved in the horizontal direction such as the X-axis direction and the Y-axis direction or the vertical direction such as the Z-axis direction.

The supply head 4 is a dispenser to drop a liquid-repellent material in a liquid form. The supply head 4 stores the liquid-repellent material supplied from a tank or the like outside the treatment chamber 2, and supplies the liquid-repellent material stored therein to the template W on the stage 3 by dropping it thereto. The supply head 4 is electrically connected to the controller 9, and is driven under the control of the controller 9. The liquid-repellent material in a liquid form has translucency, and is a material that repels the liquid material to be transferred. Examples of the material include a silane coupling agent.

The imaging unit 5 is attached to the upper surface of the treatment chamber 2 so as to be able to capture images of the template W on the stage 3, in particular, the convex portion 12 and the surroundings thereof. The imaging unit 5 is electrically connected to the controller 9, and sends captured images (for example, a planar image of the convex portion 12) to the controller 9.

The Y-axis moving mechanism 6 supports the supply head 4, and guides the supply head 4 in the Y-axis direction to move it. The pair of Z-axis moving mechanisms 7A and 7B horizontally support the Y-axis moving mechanism 6, and guides the Y-axis moving mechanism 6 together with the supply head 4 in the Z-axis direction to move it. The Y-axis moving mechanism 6 and the Z-axis moving mechanisms 7A and 7B are arranged in a portal shape. The pair of X-axis moving mechanisms 8A and 8B support the Z-axis moving mechanisms 7A and 7B in an upright state, and guide the Z-axis moving mechanisms 7A and 7B in the X-axis direction to move them.

The Y-axis moving mechanism 6 and the pair of X-axis moving mechanisms 8A and 8B function as a horizontal moving mechanism that relatively moves the stage 3 and the supply head 4 in the horizontal direction. Besides, the pair of Z-axis moving mechanisms 7A and 7B function as a vertical moving mechanism that relatively moves the stage 3 and the supply head 4 in the vertical direction. The moving mechanisms 6, 7A, 7B, 8A, and 8B are electrically connected to the controller 9, and are driven under the control of the controller 9. Examples of the moving mechanisms 6, 7A, 7B, 8A, and 8B include various moving mechanisms such as linear motor moving mechanisms, air stage moving mechanisms, and feed screw moving mechanisms.

The controller 9 includes a microcomputer to intensively control each unit, and a storage (both not illustrated) configured to store process information and various programs related to the coating process. The controller 9 controls the supply head 4 and the moving mechanisms 6, 7A, 7B, 8A and 8B, and the like based on the process information and the programs so that the supply head 4 drips the liquid-repellent material in a liquid form continuously (intermittently) onto the main surface 11a of the template W on the stage 3 along the planar shape of the upper surface (end surface) of the convex portion 12.

Next, the coating process performed by the template manufacturing apparatus 1 will be described.

As illustrated in FIG. 2, in the coating process, first, the supply head 4 is moved along the stage 3 by the moving mechanisms 6, 8A and 8B, and thereby faces a predetermined supply position on the main surface 11a at a predetermined distance L1 from the side surface of the convex portion 12 of the template W on the stage 3. Then, a liquid-repellent material 4a in a liquid form is gradually released from the tip of the supply head 4. At this time, the liquid-repellent material 4a is held at the tip of the supply head 4 by the surface tension and becomes spherical. In order to create this state, the controller 9 controls the supply head 4 so that the outflow rate, outflow speed, and the like of the liquid-repellent material 4a are under predetermined conditions.

Figure 3:
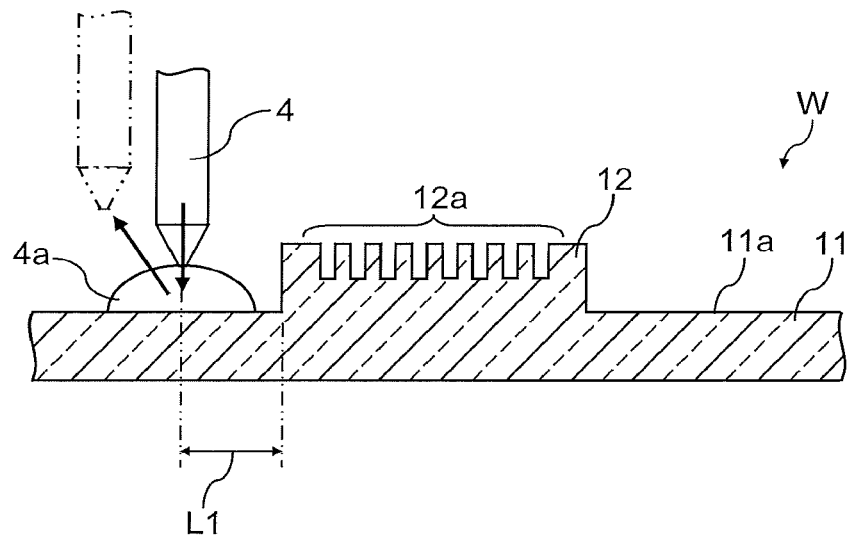
FIG. 3 is a second cross-sectional view for explaining a coating process of the first embodiment.
Figure 4:
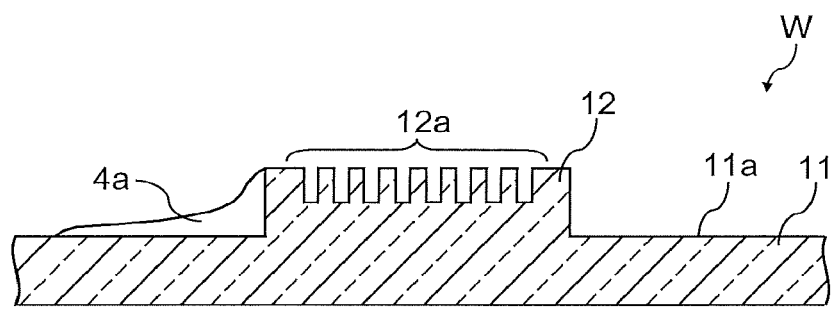
FIG. 4 is a third cross-sectional view for explaining a coating process of the first embodiment.

Then, as illustrated in FIG. 3, the supply head 4 that holds the spherical liquid-repellent material 4a at the tip is moved downward by the pair of Z-axis moving mechanisms 7A and 7B, and stops at a predetermined height where the spherical liquid-repellent material 4a at the tip is in contact with the main surface 11a of the template W. That is, the supply head 4 stops moving when the spherical liquid-repellent material 4a at the tip contacts the main surface 11a of the template W or after contacting it. As a result, the spherical liquid-repellent material 4a is supplied to the supply position on the main surface 11a from the tip of the supply head 4.

Incidentally, the liquid-repellent material 4a in a liquid form may be discharged from the tip of the supply head 4 after the liquid-repellent material 4a is held at the tip and is positioned at the height position where it comes in contact with the main surface 11a. In other words, the supply head 4 may discharge the liquid-repellent material 4a from its tip after it is positioned at a predetermined height by the pair of Z-axis moving mechanisms 7A and 7B.

After supplying the liquid-repellent material 4a to the main surface 11a, the supply head 4 moves obliquely upward away from the convex portion 12 of the template W on the stage 3, that is, away from the concavo-convex pattern 12a. At this time, if the supply head 4 is simply moved upward from the state where it is in contact with the liquid-repellent material 4a on the main surface 11a, the liquid-repellent material 4a may splash or drop from the tip of the supply head 4 moved upward and splash, resulting in that the liquid-repellent material 4a adheres to the concavo-convex pattern 12a. Further, when the supply head 4 is moved in the horizontal direction away from the concavo-convex pattern 12a, the liquid-repellent material 4a on the main surface 11a spreads on the side opposite to the convex portion 12 side.

Therefore, the supply head 4 is moved obliquely upward away from the concavo-convex pattern 12a as described above. Thereby, it is possible to prevent the liquid-repellent material 4a from adhering to the concavo-convex pattern 12a. Further, the liquid-repellent material 4a on the main surface 11a can be suppressed from spreading on the side opposite to the convex portion 12 side. However, conversely, when it is desired to spread the liquid-repellent material 4a on the main surface 11a to the side opposite to the convex portion 12 side, for example, the material to be transferred comes into contact with a wide range on the main surface 11a and it is desired to suppress the cured material to be transferred from adhering to the main surface 11a, the supply head 4 may be moved in the horizontal direction away from the concavo-convex pattern 12a.

Figure 5:
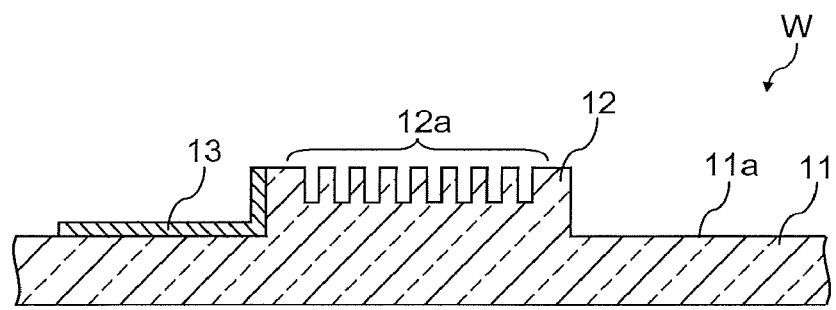
FIG. 5 is a fourth cross-sectional view for explaining a coating process of the first embodiment.

After the supplying operation described above, as illustrated in FIG. 4, the liquid-repellent material 4a supplied from the supply head 4 to the main surface 11a of the template W on the stage 3 spreads due to the wettability, and reaches the side surface of the convex portion 12 on the main surface 11a. At this time, instead of climbing over the side surface of the convex portion 12, the spread liquid-repellent material 4a adheres to the side surface due to the surface tension. When the liquid-repellent material 4a, which spreads on the main surface 11a and adheres to the side surface of the convex portion 12, is volatilized and dried, as illustrated in FIG. 5, a liquid-repellent layer 13 is formed on at least a part of the side surface of the convex portion 12 so as to avoid the concavo-convex pattern 12a on the convex portion 12.

Here, the predetermined supply position (predetermined distance L1) is set, based on the supply amount and wettability of the liquid-repellent material 4a from the supply head 4, at a position separating from the side surface of the convex portion 12 of the template W on the stage 3, where the liquid-repellent material 4a supplied to the main surface 11a of the template W on the stage 3 from the supply head spreads and adheres to the upper end of the side surface of the convex portion 12 without climbing over the side surface of the convex portion 12. Incidentally, the setting of the supply position may be based on a result of dummy discharge performed in advance using a dummy template.

Although the supply position is determined in advance, the supply position may be adjusted by the controller 9 according to the planar size and the planar shape of the upper surface (end surface) the convex portion 12 based on an image of the end surface of the convex portion 12 captured by the imaging unit 5. For example, the supply position is adjusted by the controller 9 such that the distance from the side surface of the convex portion 12 constantly becomes the predetermined distance L1 based on the planar size and the planar shape of the end surface of the convex portion 12. Thereby, even if the planar size and the planar shape of the end surface of the convex portion 12 are changed, the application position is maintained at the predetermined distance L1 from the side surface of the convex portion 12. Thus, the liquid-repellent material 4a in a liquid form supplied to the main surface 11a of the template W can be prevented from spreading and climbing over the side surface of the convex portion 12. In addition, the liquid-repellent material 4a can be reliably applied to the side surface of the convex portion 12.

Figure 6:
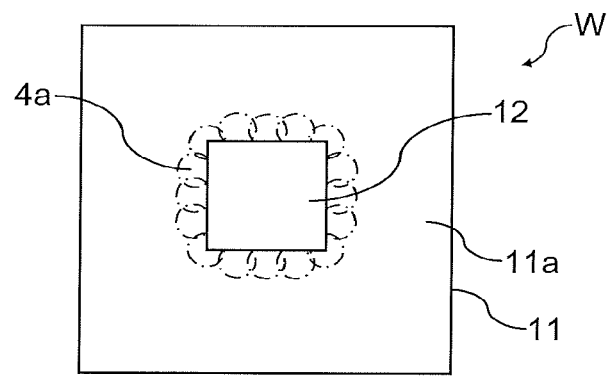
FIG. 6 is a fifth cross-sectional view for explaining a coating process of the first embodiment.

As illustrated in FIG. 6, a series of supplying operations at the supply position is repeated at predetermined intervals along the planar shape of the end surface of the convex portion 12, that is, at intervals that allow the liquid-repellent material 4a to be applied to the entire side surface of the convex portion 12. For example, while sequentially moving at predetermined intervals along the circumference of the convex portion 12, the supply head 4 repeats the supplying operation to apply the liquid-repellent material 4a in a liquid form to the entire surface of the side surface of the convex portion 12 so as to avoid the concavo-convex pattern 12a on the convex portion 12, thereby forming the liquid repellent layer 13. As a result, the liquid-repellent layer 13 is formed on the entire side surface of the convex portion 12 and a part of the main surface 11a continuous to the side surface. Although the liquid-repellent layer 13 is described as being formed on the entire side surface of the convex portion 12, it is not so limited. The liquid-repellent layer 13 is only required to be formed on at least a part of the side surface of the convex portion 12.

Figure 7:
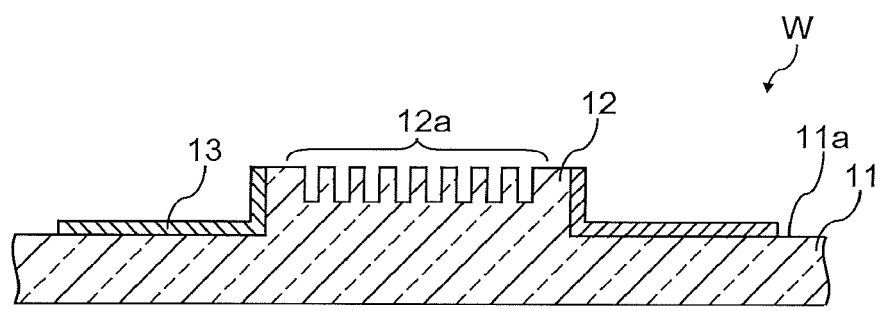
FIG. 7 is a cross-sectional view illustrating a schematic configuration of a coated template of the first embodiment.

As illustrated in FIG. 7, in the coated template W, the liquid-repellent layer 13 is provided on at least the side surface (side wall) of the convex portion 12 so as to avoid the concavo-convex pattern 12a on the convex portion 12, and further, is arranged in a predetermined region on the main surface 11a continuous to the side surface of the convex portion 12. Since the convex portion 12 has, for example, a square or a rectangular parallelepiped shape, the predetermined region around it on the main surface 11a is a quadrangular annular region in a planar view; however, the shape of the convex portion 12 and that of the annular predetermined region are not particularly limited. The liquid-repellent layer 13 has translucency, and repels the liquid material to be transferred.

Figure 8:
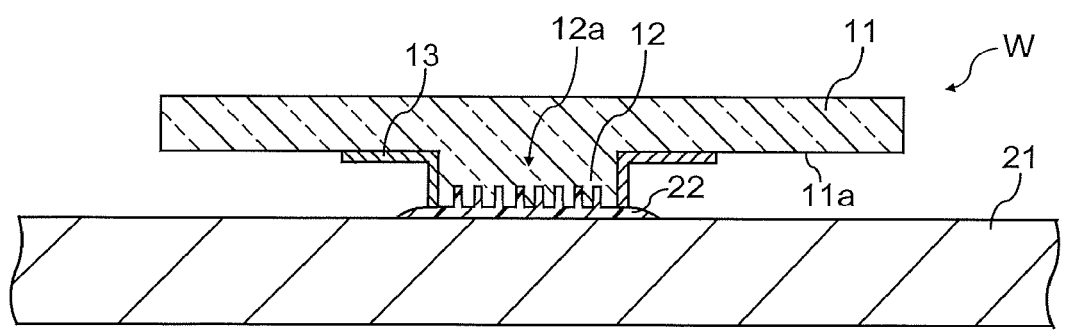
FIG. 8 is a cross-sectional view for explaining an imprint process of the first embodiment.

In an imprint process, as illustrated in FIG. 8, the template W, on which the liquid-repellent layer 13 is formed, is treated such that the concavo-convex pattern 12a on the convex portion 12 is directed to a liquid material to be transferred 22 (for example, photocurable resin) on a workpiece (for example, semiconductor substrate) 21, and is pressed against the liquid material to be transferred 22 on the workpiece 21. At this time, the liquid material to be transferred 22 seeps out from between the end surface of the convex portion 12 and the workpiece 21. However, since the liquid repellent layer 13 is formed on the side surface of the convex portion 12, the seeping liquid material to be transferred 22 is repelled by the liquid-repellent layer 13. In other words, the liquid-repellent layer 13 has the function of repelling the liquid material to be transferred 22. This suppresses the adhesion of the liquid material to be transferred 22 to the side surface of the convex portion 12. Thus, the liquid material to be transferred 22 is suppressed from being raised along the side surface of the convex portion 12.

Next, in a state where the concavo-convex pattern 12a on the convex portion 12 is pressed against the liquid material to be transferred 22, the liquid material to be transferred 22 is irradiated with light such as ultraviolet rays from the surface opposite to the surface on which the concavo-convex pattern 12a is formed. When the liquid material to be transferred 22 is cured by the light irradiation, the template W is separated from the cured material to be transferred 22, and the concavo-convex pattern 12a on the convex portion 12 is transferred to the liquid material to be transferred 22. In general, such an imprint process is repeated over the entire surface of the workpiece 21, and pattern transfer is repeatedly performed; however, the number of times of imprint is not particularly limited.

The liquid material to be transferred 22 is not limited to a liquid photocurable resin but may be, for example, a liquid thermosetting resin. In this case, the liquid material to be transferred 22 is cured by heating it with a heating unit such as, for example, a heater or a light source.

As described above, according to the first embodiment, the liquid-repellent material 4a in a liquid form is applied to the side surface of the convex portion 12 so as to avoid the concavo-convex pattern 12a on the convex portion 12 of the template W. Thereby, the liquid-repellent layer 13 can be formed on at least the side surface of the convex portion 12 so as to avoid the concavo-convex pattern 12a. With this, in the imprint process, the liquid material to be transferred 22 that has seeped out from between the convex portion 12 of the template W and the workpiece 21 is repelled by the liquid-repellent layer 13. This suppresses the adhesion of the liquid material to be transferred 22 to the side surface of the convex portion 12. Thereby, it is possible to obtain the template W that can suppress a part of the cured material to be transferred 22 from being raised and suppress the occurrence of pattern abnormality. Moreover, it is possible to obtain the template W that can suppress the breakage of the template W and the biting of a foreign substance, thereby suppressing the occurrence of pattern abnormality and template abnormality.

In addition, by the use of the supply head 4 configured to apply the liquid-repellent material 4a in a liquid form to the template W, the liquid-repellent layer 13 can be readily formed on the side surface of the convex portion 12 so as to avoid the concavo-convex pattern 12a on the end surface of the convex portion 12. Further, depending on the planar shape of the end surface of the convex portion 12, the liquid-repellent material 4a can be applied on the side surface of the convex portion 12 so as to avoid the concavo-convex pattern 12a on the convex portion 12. The liquid-repellent layer 13 can be reliably formed on the side surface of the convex portion 12.

In the imprint process, when the liquid material to be transferred 22 adheres to the side surface of the convex portion 12, generally, the template W is cleaned with a chemical solution to remove the liquid material to be transferred 22. However, according to the first embodiment, it is possible to suppress the material to be transferred 22 from adhering to the side surface of the convex portion 12 as described above. This eliminates the need of the cleaning step for removing the material to be transferred 22 from the side surface of the convex portion 12. Thereby, it is possible to eliminate the cleaning step of the template W after use as well as to prevent the pattern wear of the template W caused by the cleaning liquid and damage such as pattern collapse. As a result, the occurrence of template abnormality can be suppressed.

It is important to form the liquid-repellent layer 13 on at least the side surface of the convex portion 12 in such a way as to avoid the concavo-convex pattern 12a so as not to form the liquid-repellent layer 13 on the concavo-convex pattern 12a. This is to avoid poor transfer (misprinting) of the concavo-convex pattern 12a with respect to the liquid material to be transferred 22. That is, the concavo-convex pattern 12a is a fine pattern having a width of nanometer size. Therefore, if the liquid-repellent layer 13 is formed on the concavo-convex pattern 12a, even if it is a little, the accuracy of the dimensional width of the concavo-convex pattern 12a cannot be maintained due to the thickness of the liquid-repellent layer 13 added thereto. As a result, pattern abnormality occurs at the time of transfer.

Second Embodiment

A second embodiment will be described with reference to FIG. 9. In the second embodiment, a description is given of differences from the first embodiment (use of a frame in the coating process), and the same description will not be repeated.

Figure 9:
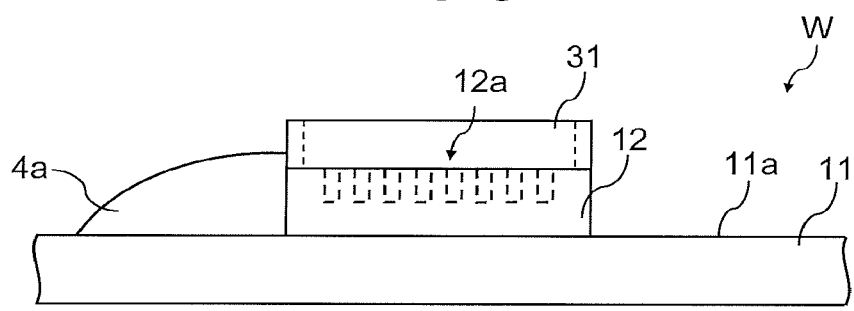
FIG. 9 is a side view illustrating a frame used in a coating process according to a second embodiment.

As illustrated in FIG. 9, in the coating process of the second embodiment, a frame 31 is placed on the upper surface (end surface) of the convex portion 12 of the template W on the stage 3 before the liquid-repellent material 4a is supplied to the main surface 11a of the template W. The frame 31 has a predetermined height (for example, about several millimeters to several tens of millimeters) and is larger than the region where the concavo-convex pattern 12a on the end surface of the convex portion 12 is formed. The frame 31 has, for example, a square shape or a rectangular shape according to the planar shape of the end surface of the convex portion 12.

The frame 31 is placed on the peripheral portion of the upper surface of the convex portion 12 so as to avoid the concavo-convex pattern 12a of the template W on the stage 3. Thereby, even if the liquid-repellent material 4a supplied to the main surface 11a of the template W spreads and tries to climb over the side surface of the convex portion 12, it is hindered by the frame 31. Thus, the liquid-repellent material 4a can be prevented from adhering to the concavo-convex pattern 12a on the convex portion 12. Further, even when the supply conditions such as the supply position and supply amount of the liquid-repellent material 4a are not appropriate, since the frame 31 can suppress the liquid-repellent material 4a from adhering to the concavo-convex pattern 12a on the convex portion 12, the supply conditions can be relaxed. Therefore, it is possible to simplify the task of achieving the conditions.

In order to suppress the liquid-repellent material 4a from adhering to the concavo-convex pattern 12a on the convex portion 12 in the coating process, a cover or the like may be used besides the frame 31 for covering the concavo-convex pattern 12a on the convex portion 12 without touching it.

As described above, according to the second embodiment, it is possible to achieve the same effects as those of the first embodiment. Further, in the coating process, the frame 31 is provided on the convex portion 12 to prevent the liquid-repellent material 4a from climbing over the side surface of the convex portion 12. Thereby, the liquid-repellent material 4a in a liquid form can be prevented from adhering to the concavo-convex pattern 12a on the convex portion 12 regardless of the supply conditions. Thus, the occurrence of pattern abnormality can be reliably suppressed.

Third Embodiment

A third embodiment will be described with reference to FIGS. 10 and 11. In the third embodiment, a description is given of differences from the first embodiment (continuous discharge of the liquid in the coating process), and the same description will not be repeated.

Figure 10:
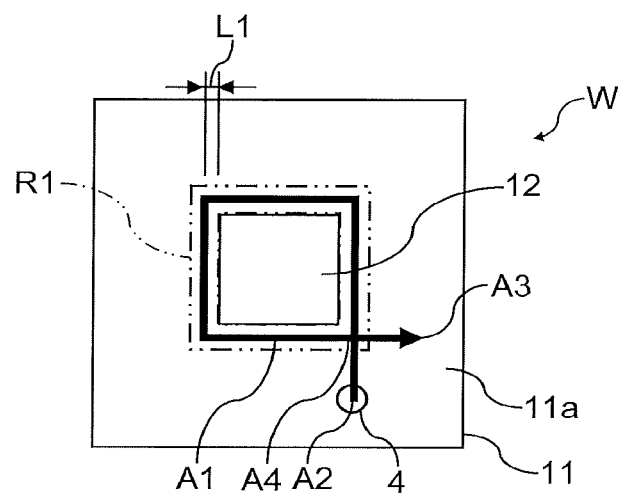
FIG. 10 is a plan view for explaining a coating process according to a third embodiment.

As illustrated in FIG. 10, in the coating process of the third embodiment, while moving along an application path A1 (see a bold arrow line in FIG. 10) on the main surface 11a of the template W, the supply head 4 continuously supplies a liquid-repellent material in a liquid form to the main surface 11a of the template W on the stage 3.

The application path A1 extends from a discharge start position A2 on the main surface 11a to a discharge stop position A3 on the main surface 11a along the outer periphery of the convex portion 12 on the main surface 11a. The path surrounding the convex portion 12 of the application path A1 is separated from the side surface of the convex portion 12 by a predetermined distance L1 (for example, 5 mm). The discharge start position A2 is a position where the supply head 4 starts discharging a liquid-repellent material. The discharge stop position A3 is a position where the supply head 4 stops the discharge of the liquid-repellent material. The discharge start position A2 and the discharge stop position A3 are located outside a coating region R1 around the convex portion 12 in the main surface 11a of the template W on the stage 3. The coating region R1 around the convex portion 12 has, for example, a frame shape, and the aspect size (edge width) of the frame-shaped coating region R1 is, for example, 10 mm or more and 20 mm or less.

First, the supply head 4 faces the discharge start position A2 on the main surface 11a of the template W on the stage 3, and starts discharging a liquid-repellent material in a liquid form. Subsequently, the supply head 4 moves along the application path A1 on the main surface 11a of the template W, that is, along the outer periphery of the convex portion 12 on the main surface 11a, while discharging the liquid-repellent material, and continuously supplies the liquid-repellent material into the coating region R1 on the main surface 11a. Since the liquid-repellent material supplied into the coating region R1 spreads due to the wettability, the liquid-repellent material is applied to the entire area of the coating region R1. Then, the supply head 4 faces the discharge stop position A3 on the main surface 11a of the template W on the stage 3, and stops the discharge of the liquid-repellent material. The controller 9 controls the supply head 4 and each of the moving mechanisms 7A, 7B, 8A and 8B, and the like according to the process information and various programs such that the supply head 4 moves along the application path A1 and continuously discharges the liquid-repellent material as described above.

In such a coating step, the supply conditions such as the height position of the supply head 4, the discharge amount, the moving speed, and the like are set such that the liquid-repellent material discharged from the supply head 4 toward the coating region R1 does not splash on the main surface 11a and adhere to the concavo-convex pattern 12a on the convex portion 12, example, the liquid-repellent material discharged from the supply head 4 toward the coating region R1 does not splash on the main surface 11a.

However, even if the supply conditions for the liquid-repellent material are set as described above, when the supply head 4 starts or stops the discharge of the liquid-repellent material while facing a position in the coating region R1, the liquid-repellent material may splash on the main surface 11a and adhere to the concavo-convex pattern 12a on the convex portion 12 at that time. As one example, that is because the discharge of the liquid and the stop thereof are unstable due to fluctuations in the liquid discharge force and discharge amount of the supply head 4 at the start and stop of liquid supply.

Therefore, as described above, the supply head 4 starts discharging the liquid-repellent material while facing the discharge start position A2 outside the coating region R1, or stops the discharge of the liquid-repellent material while facing the discharge stop position A3 outside the coating region R1. The discharge start position A2 or the discharge stop position A3 is at a distance from the concavo-convex pattern 12a, and the liquid-repellent material does not reach the concavo-convex pattern 12a on the convex portion 12 even if it splashes on the main surface 11a. Thereby, the liquid-repellent material can be prevented from splashing on the main surface 11a and adhering to the concavo-convex pattern 12a on the convex portion 12. Thus, the occurrence of pattern abnormality can be reliably suppressed.

Figure 11:
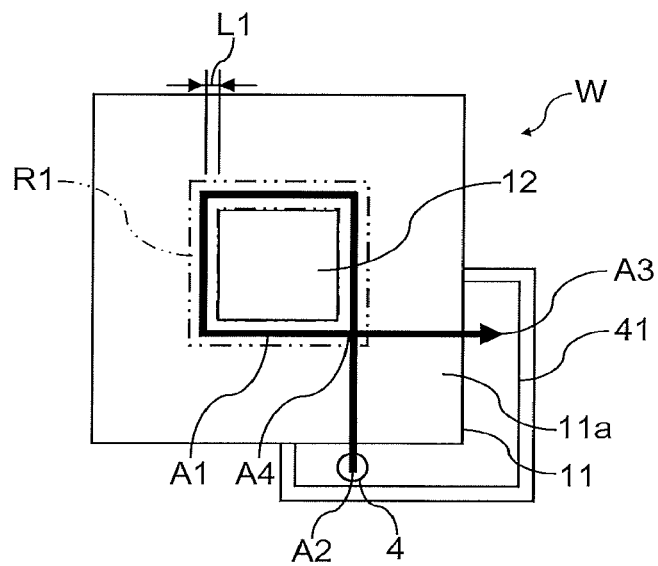
FIG. 11 is a plan view for explaining a coating process according to a modification of the third embodiment.

Further, in order to more reliably suppress the liquid-repellent material from splashing on the main surface 11a and adhering to the concavo-convex pattern 12a on the convex portion 12, it is desirable that the discharge start position A2 and the discharge stop position A3 be located outside the main surface 11a of the template W on the stage 3, that is, outside the outer peripheral edge of the main surface 11a as illustrated in FIG. 11. In this case, the liquid-repellent material does not splash on the main surface 11a. Thus, it is possible to reliably suppress the liquid-repellent material from splashing on the main surface 11a and adhering to the concavo-convex pattern 12a on the convex portion 12.

Incidentally, as illustrated in FIG. 11, since the discharge start position A2 and the discharge stop position A3 are located outside the outer peripheral edge of the main surface 11a of the template W on the stage 3, a liquid receiving portion 41 is arranged below the template W for receiving the liquid-repellent material discharged from the supply head 4 that is not located above the main surface 11a of the template W (not facing the main surface 11a). That is, the liquid receiving portion 41 receives the liquid-repellent material that the supply head 4 has discharged until it reaches the outer peripheral edge of the main surface 11a from the discharge start position A2, or until it reaches the discharge stop position A3 from the outer peripheral edge of the main surface 11a. The size and shape of the liquid receiving portion 41 are not particularly limited. The liquid receiving portion 41 is only required to receive the liquid-repellent material discharged from the supply head 4 that is not located on the main surface 11a of the template W.

The supply head 4 may be controlled such that the discharge amount of the liquid-repellent material discharged from the supply head 4 changes before the supply head 4 reaches the discharge stop position A3 from the discharge start position A2. For example, before the supply head 4 reaches the discharge stop position A3 from the discharge start position A2, the liquid-repellent material is doubly applied at the position A4 where the tracks of the supply head 4 overlap. As a result, at the position A4, the liquid-repellent material tends to be thicker. If the thickness of the liquid-repellent material becomes non-uniform, agglomerates may be generated. Therefore, it is preferable that the discharge amount of the liquid-repellent material be uniform in the tracks of the supply head 4. For this reason, the discharge amount can be adjusted such that the discharge amount of the supply head 4 is reduced at the position A4 where the tracks overlap. For example, the supply head 4 may be controlled to discharge approximately the same amount of the liquid-repellent material in the position A4 where the tracks overlap and other positions.

As described above, according to the third embodiment, it is possible to achieve the same effects as those of the first embodiment. Further, in the coating process in which a liquid is continuously discharged, the discharge start position A2 and the discharge stop position A3 are located outside the coating region R1 around the convex portion 12 in the main surface 11a of the template W. Thereby, the liquid material can be prevented from splashing on the main surface 11a and adhering to the concavo-convex pattern 12a on the convex portion 12. Thus, the occurrence of pattern abnormality can be reliably suppressed.

Other Embodiments

In each of the above embodiments, the liquid-repellent layer 13 is described as being formed on the entire side surface of the convex portion 12 and a part of the main surface 11a continuous to the side surface; however, it is not so limited. For example, the liquid-repellent layer 13 is only required to be formed on at least the side surface of the convex portion 12 so as to avoid the concavo-convex pattern 12a on the convex portion 12. The liquid-repellent layer 13 may be formed on a part of the end surface of the convex portion 12 or on the entire main surface 11a except the convex portion 12 in addition to the side surface of the convex portion 12. Further, the liquid-repellent layer 13 may be formed on a part of the end surface of the convex portion 12 and on the entire main surface 11a except the convex portion 12 in addition to the side surface of the convex portion 12. Besides, it is only required to form the liquid-repellent layer 13 on a portion of the side surface of the convex portion 12 that comes in contact with the material to be transferred 22, and the liquid-repellent layer 13 may be formed on a part of the side surface of the convex portion 12.

While, in the above embodiments, the liquid-repellent layer 13 is described as a single layer by way of example, the liquid-repellent layer 13 is not limited to a single layer, and a stack of a plurality of layers may be used. Further, the side surface (side wall) of the convex portion 12 may be perpendicular to the main surface 11a or may be inclined. In addition, the side surface of the convex portion 12 may be flat or may have a step.

In each of the above embodiments, a dispenser is exemplified as an example of the supply head 4; however, it is not so limited. Instead of a dispenser configured to drop a liquid-repellent material in a liquid form, a sponge brush which is soaked with the liquid-repellent material, a pen, an ink jet head which discharges the liquid-repellent material, or the like can be used. In the case of using a sponge brush, a pen or the like, other than the template W in the state as illustrated in FIG. 1, the template W may be reversed such that the convex portion 12 faces downward in the direction of gravity and supported by the support members 3a having some degree of height, and the liquid liquid-repellent material may be applied from below the template W. Alternatively, the template W may be supported such that the main surface 11a is inclined, and the liquid-repellent material may be applied from the oblique direction of the template W.

While, in the above embodiments, the supply head 4 is described as being moved in the X, Y, and Z-axis directions by the horizontal moving mechanism or the vertical moving mechanism, the stage 3 may be moved. In this case, the stage 3 may be provided with a horizontal moving mechanism and a vertical moving mechanism. That is, it suffices if the supply head 4 and the stage 3 can move relative to each other, and either one or both of them may be moved. In this case, the controller 9 can control the relative movement of the stage 3 and the supply head 4.

Although a semiconductor substrate is exemplified as the workpiece 21, it is not limited thereto. The workpiece 21 may be a quartz substrate used as a replica template.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint template treatment apparatus comprising:
a stage configured to support a template that includes a base having a main surface, and a convex portion integrally formed with the main surface, wherein the convex portion has an end surface and a side surface that is adjacent to the end surface and intersects the main surface of the base, and a concavo-convex pattern to be pressed against a liquid material to be transferred is formed on the end surface;
a supply head configured to supply a liquid-repellent material in a liquid form, which repels the liquid material to be transferred, to the template on the stage;
a moving mechanism configured to move the stage and the supply head relative to each other in a direction along the stage;
a storage configured to store, in advance, an application path that is separated from the side surface of the convex portion by a predetermined distance and located on the main surface; and
a controller configured to control the supply head and the moving mechanism to apply the liquid-repellent material to the template based on the application path stored in the storage,
wherein the application path extends from a discharge start position of the supply head on the main surface to a discharge stop position of the supply head on the main surface along an outer periphery of the convex portion on the main surface.

2. The imprint template treatment apparatus according to claim 1, wherein
the storage is further configured to store, in advance, the application path where the liquid-repellent material supplied to the main surface spreads and adheres to an upper end of the side surface of the convex portion without climbing over the side surface of the convex portion, and a discharge amount of the liquid-repellent material that the liquid-repellent material supplied to the main surface spreads and adheres to the upper end of the side surface of the convex portion without climbing over the side surface of the convex portion, and
the controller is further configured to control the moving mechanism such that the supply head moves along the application path based on the application path stored in the storage, and control the supply head based on the discharge amount stored in the storage.

3. The imprint template treatment apparatus according to claim 1, further comprising a vertical moving mechanism configured to move the stage and the supply head relative to each other in vertical direction,
wherein the controller is further configured to control the moving mechanism and the vertical moving mechanism to move the supply head, which has supplied the liquid-repellent material to the template on the stage, obliquely upward away from the convex portion.

4. The imprint template treatment apparatus according to claim 1, further comprising a vertical moving mechanism configured to move the stage and the supply head relative to each other in vertical direction,
wherein the controller is further configured to control the supply head to discharge and hold the liquid-repellent material in a spherical shape and control the vertical moving mechanism to move the stage and the supply head relative to each other in the vertical direction until the liquid-repellent material held in a spherical shape by the supply head contacts the main surface.

5. The imprint template treatment apparatus according to claim 1, wherein the controller is further configured to control the supply head and the moving mechanism such that the supply head applies the liquid-repellent material to the end surface so as to avoid the concavo-convex pattern in addition to the side surface of the convex portion.

6. The imprint template treatment apparatus according to claim 5, wherein the controller is further configured to control the supply head and the moving mechanism such that the supply head applies the liquid-repellent material to the entire main surface except the convex portion so as to avoid the concavo-convex pattern in addition to the side surface of the convex portion.

7. The imprint template treatment apparatus according to claim 1, wherein the controller is further configured to control the supply head and the moving mechanism such that the supply head applies the liquid-repellent material to the entire main surface except the convex portion so as to avoid the concavo-convex pattern in addition to the side surface of the convex portion.

8. The imprint template treatment apparatus according to claim 1, wherein the controller is further configured to control the supply head and the moving mechanism such that the supply head starts discharging the liquid-repellent material while facing a position outside a coating region around the convex portion in the main surface, continuously supplies the liquid-repellent material to the coating region while moving relative to the template on the stage, and stops discharging the liquid-repellent material while facing a position outside the coating region in the main surface.

9. The imprint template treatment apparatus according to claim 8, wherein the position at which discharge of the liquid-repellent material is started and the position at which the discharge of the liquid-repellent material is stopped are located outside outer peripheral edge of the main surface.

10. An imprint template treatment apparatus comprising:
a stage configured to support a template that includes a base having a main surface, and a convex portion integrally formed with the main surface, wherein the convex portion has an end surface and a side surface that is adjacent to the end surface and intersects the main surface of the base, and a concavo-convex pattern to be pressed against a liquid material to be transferred is formed on the end surface;
a supply head configured to supply a liquid-repellent material in a liquid form, which repels the liquid material to be transferred, to the template on the stage;
a moving mechanism configured to move the stage and the supply head relative to each other in a direction along the stage;
an imaging unit configured to photograph a planar shape of the end surface;
a storage configured to store, in advance, a predetermined distance between the side surface of the convex portion and a supply position of the liquid-repellent material; and
a controller configured to calculate an application path that is separated from the side surface of the convex portion by the predetermined distance and located on the main surface based on the planar shape of the end surface photographed by the imaging unit and the predetermined distance stored in the storage, and control the supply head and the moving mechanism to apply the liquid-repellent material to the template based on the application path.

11. The imprint template treatment apparatus according to claim 10, further comprising a treatment chamber configured to accommodate the stage, the supply head, the moving mechanism, and the imaging unit,
wherein the stage and the imaging unit are fixed in the treatment chamber so as to face each other.

* * * * *